United States Patent [19]

Sarkozy

[11] Patent Number: 4,573,431
[45] Date of Patent: Mar. 4, 1986

[54] MODULAR V-CVD DIFFUSION FURNACE

[75] Inventor: Robert F. Sarkozy, Westford, Mass.

[73] Assignee: BTU Engineering Corporation, North Billerica, Mass.

[21] Appl. No.: 757,920

[22] Filed: Jul. 22, 1985

Related U.S. Application Data

[63] Continuation of Ser. No. 552,454, Nov. 16, 1983, abandoned.

[51] Int. Cl.[4] .............................................. C23C 11/00
[52] U.S. Cl. ................................... 118/725; 118/728; 118/715; 118/733; 414/253
[58] Field of Search ............... 118/715, 722, 724, 728, 118/733, 729, 725, 500; 156/610, 613, 345, 614, 612; 148/187, 188; 414/217; 432/9, 121, 253; 427/255, 255.1

[56] References Cited

U.S. PATENT DOCUMENTS

| | | | |
|---|---|---|---|
| 3,183,130 | 5/1965 | Reynolds et al. | 148/187 |
| 3,189,494 | 6/1965 | Short | 118/725 X |
| 4,129,090 | 12/1978 | Iraniwa et al. | 118/733 X |
| 4,223,048 | 9/1980 | Engle, Jr. | 118/728 |
| 4,253,887 | 3/1981 | Jolly | 156/605 |
| 4,315,479 | 2/1982 | Toole et al. | 118/715 |
| 4,351,805 | 9/1982 | Reisman et al. | 118/729 |
| 4,412,812 | 11/1983 | Sadowski et al. | 432/121 |
| 4,449,037 | 5/1984 | Shibamata et al. | 118/725 X |
| 4,466,381 | 8/1984 | Jenkins | 118/500 |
| 4,510,177 | 4/1985 | Furumura et al. | 427/85 |

FOREIGN PATENT DOCUMENTS

| | | |
|---|---|---|
| 530299 | 9/1956 | Canada ............................... 118/726 |
| 2746427 | 4/1979 | Fed. Rep. of Germany . |
| 2821131 | 11/1979 | Fed. Rep. of Germany . |
| 54329 | 3/1982 | Japan . |

Primary Examiner—Bernard F. Plantz
Attorney, Agent, or Firm—Weingarten, Schurgin, Gagnebin & Hayes

[57] ABSTRACT

A novel modular V-CVD diffusion furnace includes a cylindrical quartz diffusion tube having integral end flanges, a first metallic sealing plate having gas ports removably fastened to one flange, a second metallic sealing plate having a plurality of precisely aligned gas injection tube receiving apertures removably fastened to the other flange, a like plurality of gas injection tubes slidably mounted in and sealed to corresponding gas injection tube receiving apertures, and a cylindrical quartz liner slidably mounted in the cylindrical diffusion tube.

4 Claims, 4 Drawing Figures

MODULAR V-CVD DIFFUSION FURNACE

This application is a continuation of application Ser. No. 552,454, filed Nov. 16, 1983, now abandoned.

FIELD OF THE INVENTION

This invention is directed to the field of integrated circuit fabrication, and more particularly, to a novel modular V-CVD diffusion furnace.

BACKGROUND OF THE INVENTION

Semiconductor wafers are typically batch processed in vacuum chemical vapor deposition (V-CVD) diffusion furnaces to form thin-film thereon of selected characteristics during various integrated circuit fabrication processes. The heretofore known V-CVD diffusion furnaces include a cylindrical diffusion tube having on one end an opening dimensioned to accept a batch of wafers to be processed, a tapering neck on its other end in communication with a controlled source of vacuum, and one or more gas-injection tubes slidably received in the tapering neck of the cylindrical diffusion tube. Reactant in gas phase injected into the diffusion furnace pyrolytically decomposes and deposits thin-film in solid phase not only on the semiconductor wafers, but also on the inside surface of the diffusion tube itself as well as on the surfaces of the one or more gas-injection tubes. The batch of coated wafers is then removed from the furnace, and the same or another process is run on another batch of wafers. With each such usage, the covering-thickness of the thin-film on the walls of the furnace and tubes increases, necessitating chemical etching to remove the build-up therefrom at regular intervals.

The heretofore known diffusion furnaces are disadvantageous due to the considerable labor and lost-revenue costs incurred each time it is necessary to remove the deposit build-up. For cleaning, the diffusion furnace is turned off to allow it to cool to room temperature. Thereafter, the diffusion tube and gas injection tubes are disconnected from the gas control subsystem, the vacuum subsystem, and the heating subsystem, and mechanically removed from the diffusion furnace. Prior to reconnection, air that has leaked into the disconnected gas control subsystem must be purged. The cleaned diffusion tube is then reconnected to the heating, vacuum, and gas subsystems. The one or more cleaned gas injection tubes are then reinserted and reconnected. Typically, the abovedescribed cleaning procedure takes fromm one to two days during which the furnace is inoperable with consequent loss of revenues.

The heretofore known diffusion furnaces are additionally disadvantageous in that the reconnection of the gas injection tubes is a comparatively complex procedure. Due to the difficulty of precisely realigning the gas injection tubes in the sloping walls of the tapering neck of the diffusion tube, injection tube reconnection is both a tedious and a time consuming procedure.

The heretofore known diffusion furnaces are further disadvantageous due to the fact that a diffusion tube having a tapering neck is itself an expensive component to fabricate, procure, repair, and replace. The tapering neck is comparatively fragile, and may break in use and during handling as a result of internal strain induced by both mechanical gas injection tube insertion stress and thermal stress during the operation of the furnace. Moreover, the replacement of a broken tube involves the same costly and time-consuming procedure used for furnace cleaning, and may possibly result in the contamination of a batch of wafers should breakage arise in use.

SUMMARY OF THE INVENTION

The vacuum chemical vapor deposition diffusion (V-CVD) furnace of the present invention overcomes these and other disadvantages and contemplates a modular construction that allows the cleaning and replacement of the diffusion tube without cooling the diffusion furnace to ambient and without disconnecting it from its supporting subsystems, and allows the cleaning and expeditious replacement of the gas injection tubes in a manner that ensures precise re-alignment. The novel modular V-CVD diffusion furnace of the present invention has a simple, symmetrical construction that is comparatively inexpensive and durable, that has a long operating life, and that results in considerably increased profits due to its comparatively low down-time. The modular V-CVD diffusion furnace of the present invention includes a cylindrical quartz diffusion tube having open ends. First and second integral annular flanges each surrounding an open end are provided on the tube. A cylindrical quartz liner having open ends is slidably mounted in the cylindrical diffusion tube. A first metal door having a central aperture dimensioned to allow the insertion and removal therethrough of a batch of semiconductor wafers is removably fastened in air-tight sealing engagement with the first annular flange of the cylindrical diffusion tube. A second metal door having a central aperture for connection to a vacuum pump, and a plurality of precisely aligned gas-injection tube receiving apertures, is removably fastened to the second annular flange in air-tight sealing engagement therewith. In this manner, a liner that is coated with a thick deposit is readily slidably removed from the diffusion tube, and replaced by a clean liner, while the diffusion furnace is both still hot and connected to its supporting subsystems. One or more gas injection tubes that are coated with a thick deposit are likewise slidably removed from the injection tube receiving apertures provided in the second door, and clean tubes are readily replaced in precise alignment, likewise while the furnace is both still hot and connected to its supporting subsystems. The metal doors, due to their rugged construction, are substantially free of mechanically and thermally induced breakage. It has been found that the novel modular V-CVD diffusion furnace of the present invention extends the interval between routine down-time cleaning of the diffusion tube by a factor between twenty and fifty over the heretofore known furnaces, thereby providing considerable saving in time and labor, and a significantly enhanced processing throughout capability.

BRIEF DESCRIPTION OF THE DRAWINGS

These and other features and advantages of the present invention will become apparent as the invention becomes better understood by referring to the following exemplary and non-limiting detailed description of the preferred embodiment, and to the drawings, wherein.

DETAILED DESCRIPTION OF THE INVENTION

Figure 1:
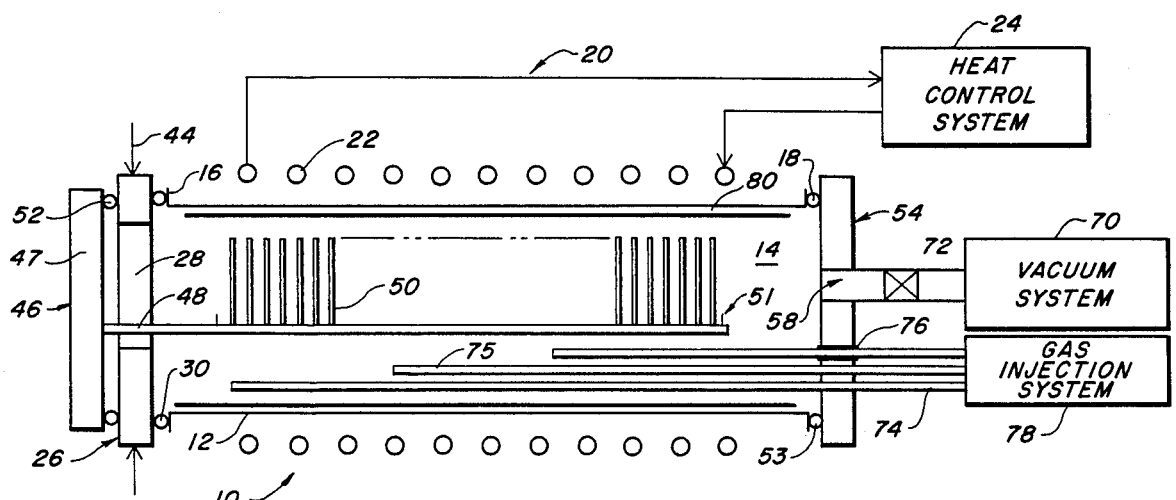
FIG. 1 is a not-to-scale pictorial view of the modular vacuum chemical vapor deposition (V-CVD) diffusion furnace according to the present invention.

Referring now to FIG. 1, generally designated at 10 is a novel modular vacuum chemical vapor deposition (V-CVD) diffusion furnace according to the present invention. The furnace 10 includes a symmetrical diffusion tube 12 having open ends that defines a longitudinally extending reaction chamber 14. The tube 12 is preferably cylindrically shaped and is fashioned from any suitable high-temperature material such as quartz. Annular quartz flanges 16, 18 are integrally formed with the tube 12 respectively surrounding the open ends thereof.

A heating system generally designated 20 is coupled to the diffusion tube 12 to controllably maintain a selected temperature in the reaction chamber 14. The heating system 20 preferably includes a resistance element 22 coiled peripherally around the diffusion tube 12 that is connected to a heat control system 24. The heat control system 24 is operative in known manner to selectively energize coil 22 to establish an intended temperature in the chamber 14. One or more thermocouples, not shown, are positioned in the chamber 14 and electrically connected to the heat control system 24 to precisely maintain a selected temperature in the chamber 14 to within a selected tolerance.

Figure 2:
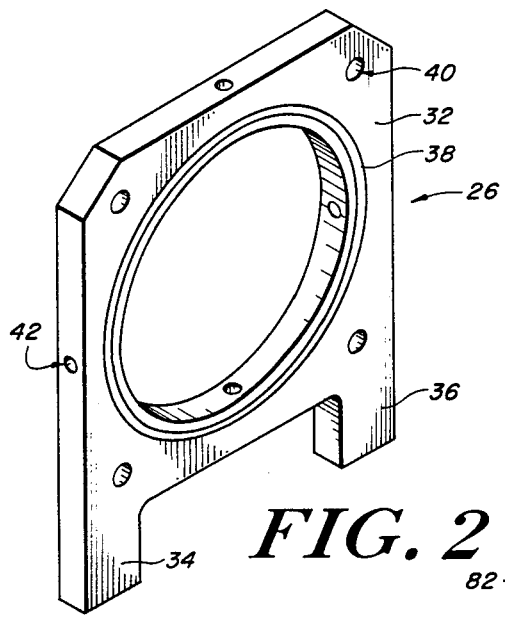
FIG. 2 is a perspective view of a first metal door of the modular V-CVD diffusion furnace of the present invention.

A first door generally designated 26 having a central aperture 28 is removably fastened in air-tight sealing engagement with the annular flange 16 via an O-ring 30. As best seen in FIG. 2, the door 26 includes a plate 32, preferably fashioned from any suitable metal such as stainless steel, having upstanding integral spaced support legs 34, 36. An annular groove 38 is provided circumferentially around the central opening 28 that is dimensioned to accept the O-ring 30 (FIG. 1). A plurality of apertures 40 are provided peripherally around the groove 38 and through the plate 32 to provide mounting openings for removably fastening the plate 32 to the flange 16 (FIG. 1). A plurality of radially extending bores 42 defining gas injection ports are provided through the circumferential wall of the door 26 that are individually in communication with the chamber 14 (FIG. 1) for controllably injecting reactant in gas phase thereinto as illustrated at 44 (FIG. 1).

A boat loader generally designated at 46 is removably fastened in air-tight sealing engagement with the first door 26. The boat loader 46 includes a plate 47 having a longitudinally extending cantilevered arm 48. Although a cantilevered arm is illustrated, it is noted that carriage-type and wheelbarrow-type arms can be employed as well. A plurality of semiconductor wafers 50 are supported in a boat 51 of conventional design in longitudinally spaced apart relation, with the plane of the wafers being generally coincident with the vertical plane. The plate 47 of the boat loader 46 is connected to a motor that controls its translation, not illustrated, for inserting the arm 48 into the reaction chamber 14 and for removing the arm 48 out of the reaction chamber, and therewith the boat-loaded wafers 50. The plate 47 of the boat loader 46 is sealed to the door 26 via an O-ring 52.

Figure 3:
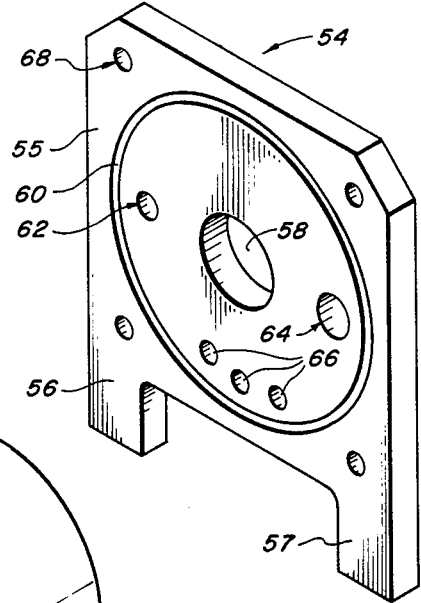
FIG. 3 is a perspective view of a second metal door of the modular V-CVD diffusion furnace of the present invention.

A second door generally designated 54 is removably fastened to the annular flange 18 in air-tight sealing engagement therewith via an O-ring 53. As best seen in FIG. 3, the door 54 includes a plate 55, preferably fastened from any suitable metal such as stainless steel, having upstanding integral spaced support legs 56, 57. The plate 55 is provided with a central aperture 58 for connection to a controlled source of vacuum, an annular groove 60 surrounding the aperture 58 adapted to accept the O-ring 53 (FIG. 1), a bore 62 intermediate the groove 60 and the central bore 58 for connection to a vacuum monitoring device, a bore 64 intermediate the groove 60 and the bore 58 for connection to a temperature monitoring device, and three precisely aligned gas injection tube receiving apertures 66 intermediate the groove 60 and the central bore 58. A plurality of apertures 68 are provided peripherally around the groove 60 and through the plate 55 to provide mounting openings for removably fastening the plate 55 to the annular flange 18 (FIG. 1).

A vacuum unit 70 is connected to the bore 58 (FIG. 3) via a coupling 72 for controllably maintaining a selected vacuum condition in the chamber 14. A plurality of gas-injection tubes 74 having apertures 75 are slidably mounted through the precisely aligned apertures 66 (FIG. 3) and are held in air-tight sealing engagement with the confronting walls of the openings 66 by any suitable gasket 76 such as the Ultra-Torr fitting commercially available from Cambridge Valve and Fitting Co., Cambridge, Mass. Each of the injection tubes 74 are operatively connected to a gas-injection system 78. The gas-injection system 78 is operative to controllably introduce preselected reactant in gas phase into the reaction chamber 14 selected for any one of various V-CVD processes well-known to those skilled in the art.

Figure 4:
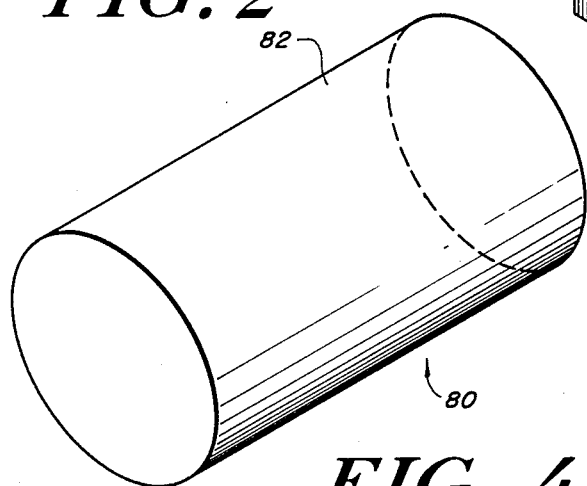
FIG. 4 is a perspective view of a cylindrical quartz liner of the modular V-CVD diffusion furnace of the present invention.

A liner generally designated 80 is slidably inserted into the diffusion tube 12. As can best be seen in FIG. 4, the liner 80 preferably includes a cylinder 82 having open ends fashioned from any suitable high-temperature material such as quartz. The dimension of the cylinder 82 is selected to be just less than the longitudinal dimension of the diffusion tube 12, and has an outside diameter selected to be just less than the inside diameter of the cylindrical diffusion tube 12.

In operation, the gas-injection system 78 injects through the plurality of apertures 75 of the gas-injection tubes 74 reactant in gas phase into the reaction chamber 14, which is maintained at a selected temperature by the heating control system 24, and under precise vacuum conditions by the vacuum system 70. Gas injected through the ports 44 into the chamber 14 pyrolytically decomposes with the reactant in gas phase injected through the apertures 75 of the tubes 74 to deposit thin-film in solid phase on the planar surfaces of the wafers 50 as well as on the gas-injection tubes 74 and on the liner 80. After continued use, the solid-phase deposits build up to layers on both the liner and the injection tubes requiring their cleaning by chemical etching or other suitable technique.

In the case where the liner needs to be removed for cleaning, the door 26 is unfastened from the flange 16, and the soiled liner 80 is slidably removed from the diffusion tube 12 and replaced by a clean liner while the furnace is still warm without having to disconnect the vacuum system 70, the gas-injection system 78, or the heating system 20, as in the heretofore known device. Moreover, it will be appreciated that it is not necessary to purge the gas lines as in the heretofore known devices. After the insertion of a clean liner, the door 26 is rapidly fastened again in air-tight sealing engagement with the flange 16, and the boat loader 46 can introduce a new batch of wafers into the reaction chamber 14 for processing without requiring the shut-down of the furnace, thereby resulting in considerable savings of labor, and eliminating costly down-time.

In the case where the gas-injection tubes 74 need to be removed for cleaning, the soiled tubes 74 are disconnected from the gas-injection system 78, are simply slidably removed out of the apertures 66 provided therefor in the door 54, and are readily replaced by the clean injection tubes while the furnace is still warm and again without requiring disconnection from the vacuum or heating systems. Due to the precise alignment of the gas-injection tube receiving apertures 66 (FIG. 3), the placement of the clean tubes is automatically aligned to within close tolerance thereby eliminating the need to provide any additional fine-tuning. The stainless steel door 54, due to its rugged construction, is not subject to thermal or mechanical stress-induced breakage. Moreover, the symmetrical tube 12 is itself comparatively inexpensive to fabricate, procure, replace, and maintain.

It will be appreciated that many modifications of the present invention will become obvious to those skilled in the art without departing from the scope of the appended claims.

What is claimed is:

1. A modular vacuum chemical vapor deposition CVD diffusion furnace, comprising:
    a cylindrical diffusion tube having open ends and defining a cylindrical reaction chamber having an operative region along which CVD takes place;
    a boat loader;
    means for removably fastening said boat loader in air-tight sealing engagement with one of said open ends;
    means coupled to said diffusion tube for controllably heating said reaction chamber;
    a vacuum source;
    a first metallic door having an aperture and a plurality of precisely aligned gas injection tube receiving openings provided through the door spaced from each other and from said aperture;
    means for connecting said vacuum source to said aperture;
    a plurality of gas injection tubes slidably received in a corresponding one of said plurality of precisely aligned gas injection tube receiving openings and each having an end terminating at longitudinally spaced points along said operative region of and within said reaction chamber;
    a like plurality of vacuum couplings intermediate each of said gas injection tube receiving openings and a corresponding one of said gas injection tubes;
    a gas control system operatively connected to said plurality of gas injection tubes; and
    means for removably fastening said first metallic door to the other one of said ends of said cylindrical diffusion tube in air-tight sealing relationship.

2. The apparatus of claim 1, wherein said boat loader includes a second metallic door having an aperture, and a plate having a longitudinally extending cantilevered arm removably fastened to said second door with said arm extending through said aperture thereof.

3. The apparatus of claim 1, wherein said cylindrical quartz diffusion tube has a radially extending annular flange surrounding each of said open ends.

4. The apparatus of claim 3, wherein said first door is removably fastened to one of said annular flanges in an air-tight sealing relationship.

* * * * *